(12) United States Patent
Kim et al.

(10) Patent No.: US 11,888,091 B2
(45) Date of Patent: Jan. 30, 2024

(54) SEMICONDUCTOR LIGHT EMITTING DEVICE AND LIGHT EMITTING DEVICE PACKAGE

(71) Applicant: SAMSUNG ELECTRONICS CO., LTD., Suwon-si (KR)

(72) Inventors: Taehun Kim, Bucheon-si (KR); Sungwon Ko, Osan-si (KR); Bokyoung Kim, Hwaseong-si (KR); Jinhwan Kim, Seoul (KR); Wongoo Hur, Incheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 480 days.

(21) Appl. No.: 17/135,686

(22) Filed: Dec. 28, 2020

(65) Prior Publication Data

US 2021/0367108 A1 Nov. 25, 2021

(30) Foreign Application Priority Data

May 20, 2020 (KR) .......................... 10-2020-0060223

(51) Int. Cl.
*H01L 33/38* (2010.01)
*H01L 33/56* (2010.01)
*H01L 33/64* (2010.01)
*H01L 33/40* (2010.01)

(52) U.S. Cl.
CPC ............ *H01L 33/38* (2013.01); *H01L 33/405* (2013.01); *H01L 33/56* (2013.01); *H01L 33/644* (2013.01)

(58) Field of Classification Search
CPC combination set(s) only.
See application file for complete search history.

(56) References Cited

U.S. PATENT DOCUMENTS

| 6,372,608 B1 | 4/2002 | Shimoda et al. |
| 6,645,830 B2 | 11/2003 | Shimoda et al. |
| RE38,466 E | 3/2004 | Inoue et al. |
| (Continued) | | |

FOREIGN PATENT DOCUMENTS

| KR | 10-0891761 B1 | 4/2009 |
| KR | 10-2013-0051094 A | 5/2013 |
| (Continued) | | |

*Primary Examiner* — Mark W Tornow
*Assistant Examiner* — Priya M Rampersaud
(74) *Attorney, Agent, or Firm* — Sughrue Mion, PLLC

(57) ABSTRACT

A semiconductor light emitting device includes a substrate structure, first and second regions and a main region; a light emitting structure, first and second electrode layers, an interlayer insulating layer, and a pad electrode layer. The light emitting structure is provided on the third region. The first electrode layer is provided between the substrate structure and the light emitting structure, and has a first electrode extension that extends into the first region. The second electrode layer is provided between the first electrode layer and the light emitting structure, and has a second electrode extension that extends into the second region. The interlayer insulating layer is provided between the first and second electrode layers, and has an opening exposing a portion of the first electrode extension. The pad electrode layer is provided on the interlayer insulating layer, and is connected to the portion of the first electrode extension through the opening.

19 Claims, 19 Drawing Sheets

(56) References Cited

U.S. PATENT DOCUMENTS

| | | |
|---|---|---|
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,410,506 B2 | 4/2013 | Kim et al. |
| 8,426,881 B2 | 4/2013 | Slater, Jr. et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,312,249 B2 | 4/2016 | Choi et al. |
| 9,748,448 B2 | 8/2017 | Kobayakawa et al. |
| 2009/0101923 A1 | 4/2009 | Choi et al. |
| 2010/0012968 A1* | 1/2010 | Yahata .................. H01L 33/58 438/46 |
| 2010/0155693 A1* | 6/2010 | Seo ...................... H01L 27/153 257/E21.211 |
| 2014/0209941 A1* | 7/2014 | Seo ...................... H01L 33/60 257/88 |
| 2014/0252390 A1* | 9/2014 | Yoon .................... H01L 33/60 257/98 |
| 2018/0130924 A1* | 5/2018 | Ko ....................... H01L 33/38 |
| 2018/0151545 A1 | 5/2018 | Huang et al. |
| 2018/0286915 A1* | 10/2018 | Yeon .................... H01L 33/62 |
| 2020/0176632 A1* | 6/2020 | Kageyama ............ H01L 33/40 |

FOREIGN PATENT DOCUMENTS

| | | |
|---|---|---|
| KR | 10-1742617 B1 | 6/2017 |
| KR | 10-1838017 B1 | 3/2018 |
| KR | 10-1865932 B1 | 6/2018 |
| KR | 10-2023089 B1 | 11/2019 |
| KR | 10-2075151 B1 | 3/2020 |

* cited by examiner

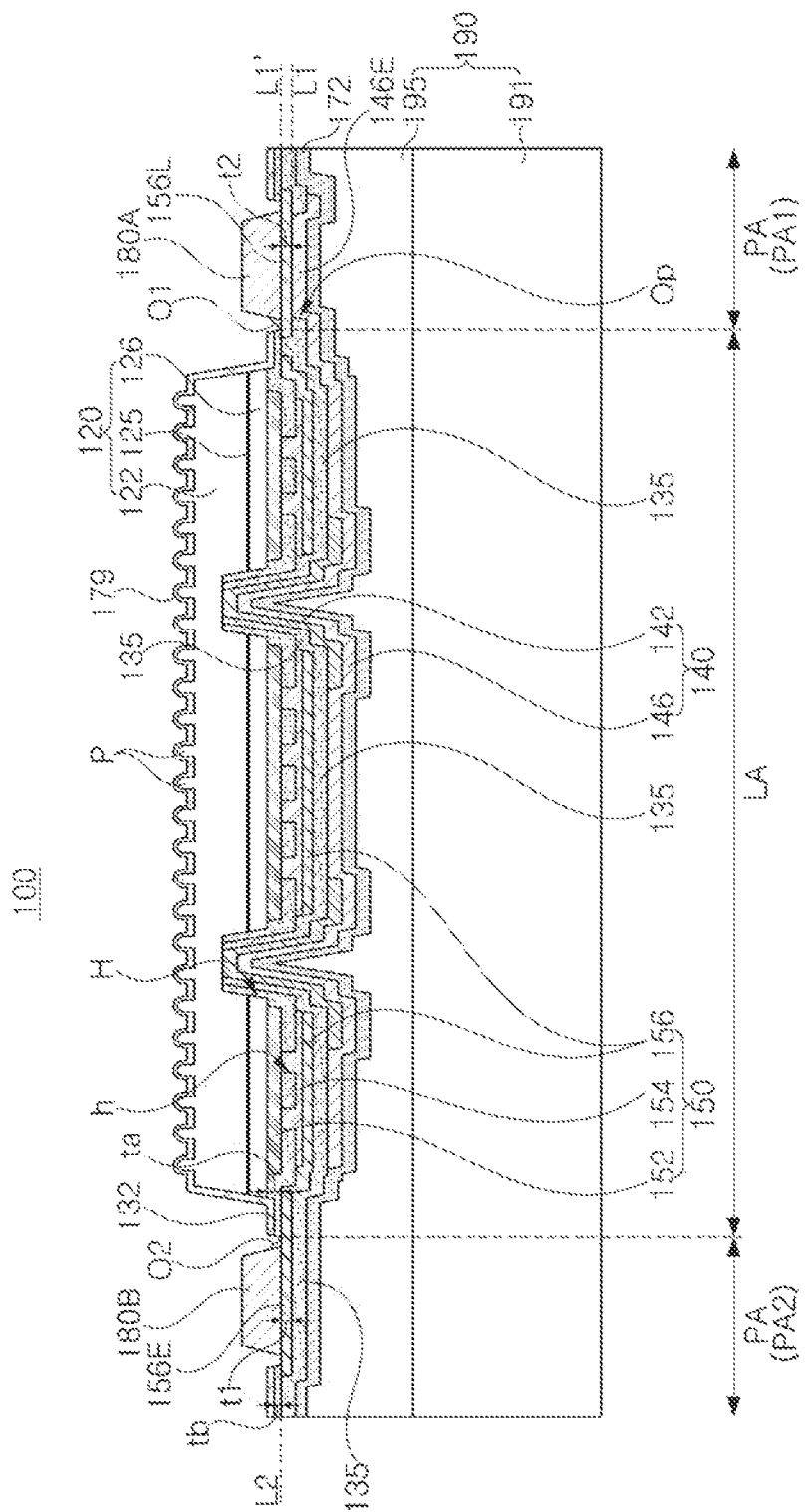

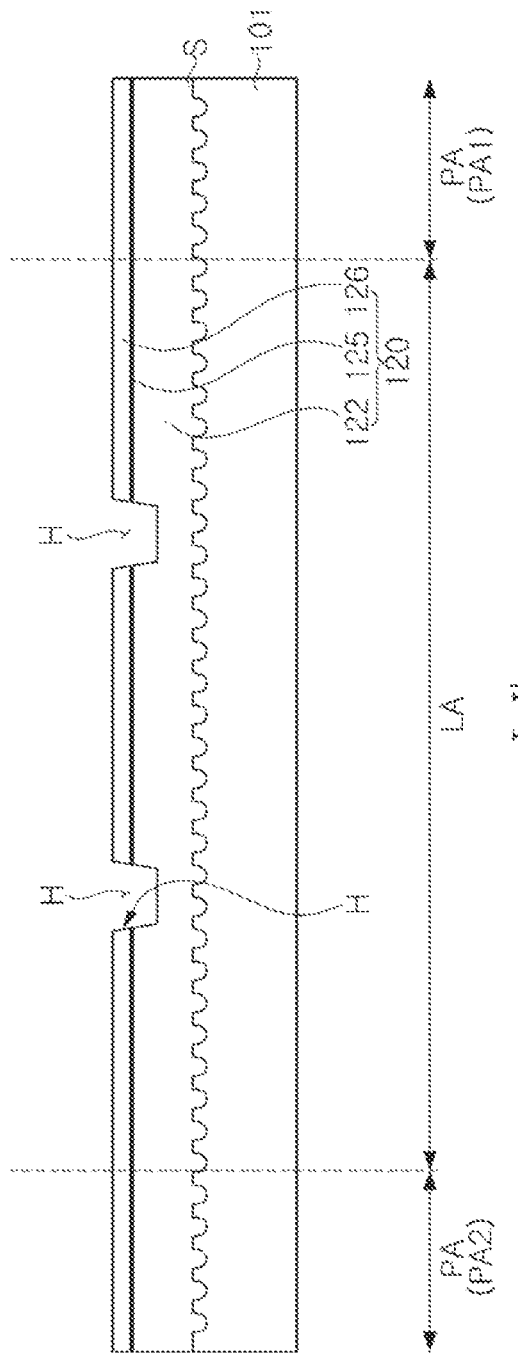

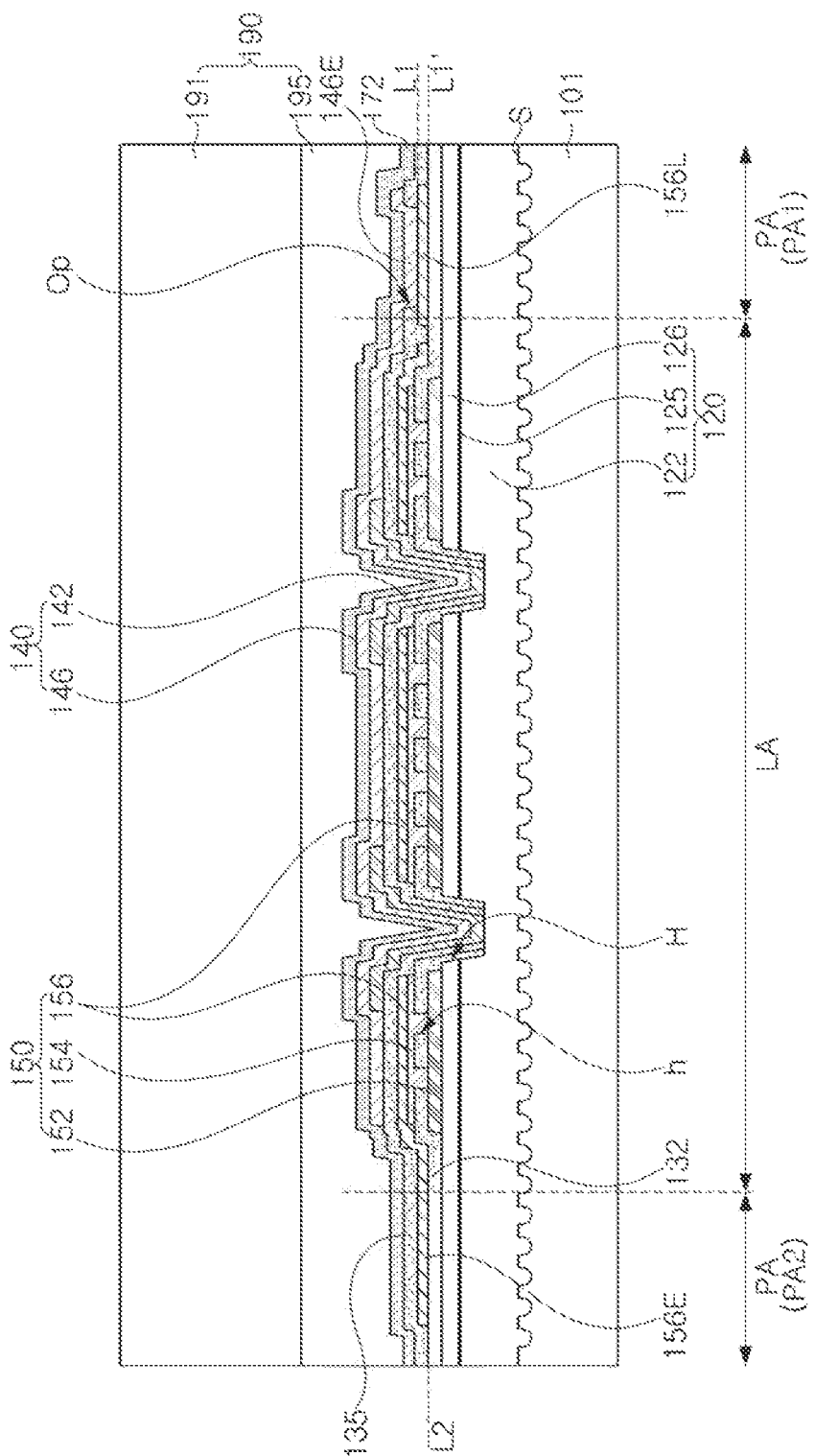

SEMICONDUCTOR LIGHT EMITTING DEVICE AND LIGHT EMITTING DEVICE PACKAGE

CROSS-REFERENCE TO RELATED APPLICATION(S)

This application claims benefit of priority to Korean Patent Application No. 10-2020-0060223 filed on May 20, 2020 in the Korean Intellectual Property Office, the disclosure of which is incorporated herein by reference in its entirety.

BACKGROUND

1. Field

The present disclosure relates to a semiconductor light emitting device and a light emitting device package.

2. Description of Related Art

A semiconductor light emitting device is a next-generation light source having advantages such as a relatively long lifespan, relatively low power consumption, relatively fast response speeds, and environmental friendliness, as compared to conventional light sources. In particular, since the semiconductor light emitting device has excellent luminous flux, the semiconductor light emitting device may be attracting attention as a main light source of various products such as electric and electronic devices and lighting devices. Meanwhile, in order to maintain reliability of semiconductor light emitting devices, interest in improving heat dissipation performance by reducing thermal resistance is increasing.

SUMMARY

It is an aspect to provide a semiconductor light emitting device having improved heat dissipation performance.

It is another aspect to provide a light emitting device package having improved heat dissipation performance.

According to an aspect of one or more embodiments, there is provided a semiconductor light emitting device comprising a substrate structure having an upper surface, the upper surface having a first region, a second region, and a third region; a light emitting structure including a first conductivity-type semiconductor layer, an active layer, and a second conductivity-type semiconductor layer, sequentially stacked on the third region of the substrate structure, and having a hole passing through the second conductivity-type semiconductor layer and the active layer; a first electrode layer disposed between the substrate structure and the light emitting structure, and connected to the first conductivity-type semiconductor layer through the hole, the first electrode layer having a first electrode extension extending onto the first region; a second electrode layer disposed between the first electrode layer and the light emitting structure, and connected to the second conductivity-type semiconductor layer, the second electrode layer having a second electrode extension extending onto the second region; an interlayer insulating layer disposed between the first electrode layer and the second electrode layer, and extending onto the first and second regions, the interlayer insulating layer having an opening in the first region exposing a portion of the first electrode extension; a pad electrode layer disposed on a portion of the interlayer insulating layer, and separated from the first electrode layer, the pad electrode layer connected to the exposed portion of the first electrode extension through the opening; and a first pad and a second pad, respectively disposed on the pad electrode layer and the second electrode extension.

According to another aspect of one or more embodiments, there is provided a semiconductor light emitting device comprising a substrate structure having an upper surface, the upper surface having a first region, a second region, and a third region; a light emitting structure having a first conductivity-type semiconductor layer, an active layer, and a second conductivity-type semiconductor layer, sequentially stacked on the third region of the substrate structure; a first electrode layer disposed between the substrate structure and the light emitting structure, and connected to the first conductivity-type semiconductor layer, and the first electrode layer having a first electrode extension extending onto the first region; a second electrode layer disposed between the first electrode layer and the light emitting structure, connected to the second conductivity-type semiconductor layer, and having a second electrode extension, extending onto the second region, wherein the second electrode extension has an upper surface higher than an upper surface of the first electrode extension; a leveling electrode layer disposed on an upper surface of the first electrode extension, and having an upper surface that reduces a level difference between the upper surface of the first electrode extension and an upper surface of the second electrode extension; an interlayer insulating layer disposed between the first electrode layer and the second electrode layer, and extending onto the first and second regions, the interlayer insulating layer having an opening that exposes the first electrode extension and the leveling electrode layer; and a first pad and a second pad, respectively disposed on the upper surface of the leveling electrode layer and the upper surface of the second electrode extension.

According to yet another aspect of one or more embodiments, there is provided a light emitting device package comprising a package substrate having a heat dissipation lead frame, a first lead frame, and a second lead frame; and a semiconductor light emitting device including a substrate structure having an upper surface having a first region, a second region, and a third region, and a lower surface contacting the heat dissipation lead frame, a light emitting structure having a first conductivity-type semiconductor layer, an active layer, and a second conductivity-type semiconductor layer, sequentially stacked on the third region of the substrate structure, and a first pad and a second pad, respectively disposed on the first and second regions, and electrically connected to the first and second lead frames, wherein the semiconductor light emitting device further comprises a first electrode layer disposed between the substrate structure and the light emitting structure, connected to the first conductivity-type semiconductor layer, and having a first electrode extension, extending onto the first region; a second electrode layer disposed between the first electrode layer and the light emitting structure, connected to the second conductivity-type semiconductor layer, and having a second electrode extension extending onto the second region, wherein the second electrode extension has the second pad disposed thereon and has an upper surface higher than an upper surface of the first electrode extension; a leveling electrode layer disposed on an upper surface of the first electrode extension, having the first pad disposed thereon, and having an upper surface that reduces a level difference between the upper surface of the first electrode extension and an upper surface of the second electrode extension; and an interlayer insulating layer disposed between the first electrode layer and the second electrode layer, extending onto the first and second regions, and having an opening that exposes the first electrode extension and the leveling electrode layer.

BRIEF DESCRIPTION OF DRAWINGS

The above and other aspects will be more clearly understood from the following detailed description, taken in conjunction with the accompanying drawings, in which:

FIG. 2 is a cross-sectional side view of the semiconductor light emitting device of FIG. 1 taken along line I-I';

FIGS. 4A, 5A, 6A, 7A, and 8A are cross-sectional views for respective operations of a method of manufacturing a semiconductor light emitting device according to an embodiment.

FIGS. 9 to 11 are cross-sectional views illustrating a method of manufacturing a semiconductor light emitting device according to an embodiment;

DETAILED DESCRIPTION

Hereinafter, various embodiments will be described in detail with reference to the accompanying drawings.

Figure 1:
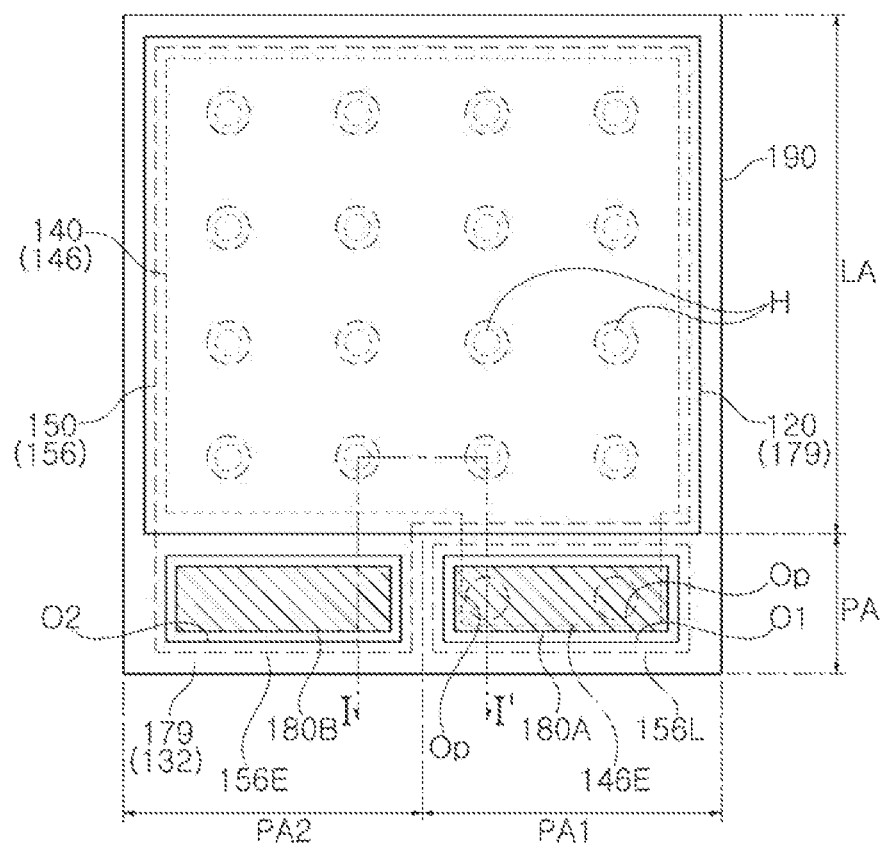
FIG. 1 is a plan view schematically illustrating a semiconductor light emitting device according to an embodiment.

FIG. 1 is a plan view schematically illustrating a semiconductor light emitting device according to an embodiment, and FIG. 2 is a cross-sectional side view of the semiconductor light emitting device of FIG. 1 taken along line I-I'.

Referring to FIGS. 1 and 2, a semiconductor light emitting device 100 may include a substrate structure 190, a light emitting structure 120 disposed on the substrate structure 190, a first electrode layer 140 disposed between the substrate structure 190 and the light emitting structure 120, a second electrode layer 150 disposed between the first electrode layer 140 and the light emitting structure 120, and an interlayer insulating layer 135 disposed between the first electrode layer 140 and the second electrode layer 150.

The substrate structure 190 may have an upper surface having a first region PA1, a second region PA2, and a main region LA (see FIG. 1). The first and second regions PA1 and PA2 may be provided as regions for forming first and second pads 180A and 180B, respectively. In the embodiment illustrated in FIGS. 1-2, the first and second regions PA1 and PA2 may be disposed on one side of the main region LA, and may be connected to each other to be provided as one pad region PA.

The substrate structure 190 may be configured to be electrically insulated from the light emitting structure 120. Even when the substrate structure 190 is a conductive structure, an insulating separation structure may be introduced such that the insulating separation structure does not act as an electrode structure connected to the first electrode layer 140 or the second electrode layer 150. For example, in the embodiment illustrated in FIGS. 1-2, the semiconductor light emitting device 100 may include an insulating separation layer 172 on a surface on which the substrate structure 190 is disposed. The insulating separation layer 172 may be disposed on the interlayer insulating layer 135 to cover the first electrode layer 140 and the second electrode layer 150.

The substrate structure 190 employed in the embodiment illustrated in FIGS. 1-2 may include a support substrate 191 and a bonding metal layer 195. For example, the support substrate 191 may be a conductive substrate such as a silicon (Si) substrate, and the bonding metal layer 195 may be a bonding metal such as Au, Sn, Ni, Au—Sn, Ni—Sn, or Ni—Au—Sn. In another embodiment, the substrate structure 190 may be formed by a plating process. Even in the case of a substrate structure formed by a plating process, the substrate structure 190 may be electrically insulated from the first electrode layer 140 and the second electrode layer 150 by the insulating separation layer 172.

Referring to FIG. 2, the light emitting structure 120 may include a first conductivity-type semiconductor layer 122, an active layer 125, and a second conductivity-type semiconductor layer 126, sequentially disposed in the main region LA of the substrate structure 190.

For example, the first conductivity-type semiconductor layer 122 may include a nitride semiconductor layer satisfying n-type $In_xAl_yGa_{1-x-y}N$ (where $0 \leq x < 1$, $0 \leq y < 1$, and $0 \leq x+y < 1$), and the n-type impurity may be Si. For example, the first conductivity-type semiconductor layer 122 may include an n-type GaN layer. The second conductivity-type semiconductor layer 126 may be a nitride semiconductor layer satisfying p-type $In_xAl_yGa_{1-x-y}N$ (where $0 \leq x < 1$, $0 \leq y < 1$, and $0 \leq x+y < 1$), and the p-type impurity may be Mg. In some embodiments, the second conductivity-type semiconductor layer 127 may be implemented in a single-layer structure, but in other embodiments, may have a multilayer structure having different compositions. The active layer 125 may have a multiple quantum well (MQW) structure in which a quantum well layer and a quantum barrier layer are alternately stacked on each other. For example, the quantum well layer and the quantum barrier layer may be $In_xAl_yGa_{1-x-y}N$ (where $0 \leq x \leq 1$, $0 \leq y \leq 1$, and $0 \leq x+y \leq 1$) having different compositions. In a specific example, the quantum well layer may be $In_xGa_{1-x}N$ (where $0 < x \leq 1$), and the quantum barrier layer may be GaN or AlGaN.

In the embodiment illustrated in FIGS. 1-2, the light emitting structure 120 may have a plurality of holes H connected to the first conductivity-type semiconductor layer 122 through the second conductivity-type semiconductor layer 126 and the active layer 125. The first electrode layer 140 that is connected to the first conductivity-type semiconductor layer 122 through the plurality of holes H may be provided on the same surface of the substrate structure 190 as a surface on which the second electrode layer 150 is formed.

The first and second electrode layers 140 and 150 employed in the embodiment illustrated in FIGS. 1-2 may be disposed to overlap each other between the light emitting structure 120 and the substrate structure 190 on different levels L1 and L2. Even when portions of the first and second electrode layers 140 and 150 overlap, the portions of the first and second electrode layers 140 and 150 may be insulated from each other by the interlayer insulating layer 135.

The first electrode layer 140 may have a first electrode extension 146E connected to the first conductivity-type semiconductor layer 122 through the plurality of holes H, and extending into the first region PA1. The second electrode layer 150 may have a second electrode extension 156E connected to the second conductivity-type semiconductor layer 126 and extending into the second region PA2. The interlayer insulating layer 135 may be disposed between the first and second electrode layers 140 and 150, and may extend into the first and second regions PA1 and PA2.

The first electrode extension 146E may have a first level L1, and the second electrode extension 156E may have a second level L2, lower than the first level L1. That is, the second level L2 may be closer to the light emitting structure 120 than the first level L1 In the embodiment illustrated in FIGS. 1-2, a leveling electrode layer 156L may be additionally introduced to eliminate the level difference (L1-L2). The interlayer insulating layer 135 may have an opening Op connected to one region of the first electrode extension 146E. An end portion of the leveling electrode layer 156L may be disposed on a portion of the interlayer insulating layer 135 located in the first region PA1 to be separated from the first electrode layer 140 (more specifically the first electrode extension 146E) by the portion of the interlayer insulating layer 135 located in the first region PA1. The leveling electrode layer 156L may be connected to the one region of the first electrode extension 146E through the opening Op.

In this manner, the leveling electrode layer 156L may be electrically connected to the first electrode extension 146E to be provided as a pad-forming region for the first electrode layer 140. In this specification, the leveling electrode layer 156L may be also referred to as a "pad electrode layer."

The leveling electrode layer 156L may reduce the level difference (L1-L2) between upper surfaces of the first and second electrode extensions 146E and 156E. A level difference (L2-L1') between the upper surface of the second electrode extension 156E and an upper surface of the leveling electrode layer 156L may be smaller than a level difference (L2-L1) between the upper surface of the second electrode extension 156E and the upper surface of the first electrode extension 142E, and advantageously, an upper surface level L1' of the leveling electrode layer 156L as in the embodiment illustrated in FIGS. 1-2 may be substantially the same as an upper surface level L2 of the second electrode extension 156E.

The first pad 180A and the second pad 180B may be disposed on the leveling electrode layer 156L and the second electrode extension 156E, respectively. In this manner, a selective etching process of the light emitting structure 120 opening the first and second regions PA1 and PA2 may be performed in a single process to reduce the level difference (L2-L1) using the leveling electrode layer 156L, to form the first and second pads 180A and 180B.

At least one of the first and second electrode layers 140 and 150 may include a plurality of electrode layers. In the embodiment illustrated in FIGS. 1-2, the first electrode layer 140 may include a first contact electrode 142 connected to the first conductivity-type semiconductor layer 122 through the plurality of holes H, and a first connection electrode 146 disposed on the first contact electrode 142 and providing the first electrode extension 146E.

Similarly, the second electrode layer 150 may include a second contact electrode 152 connected to the second conductivity-type semiconductor layer 126, and a second connection electrode 156 disposed on the second contact electrode 152 and providing the second electrode extension 156E. In addition, in the embodiment illustrated in FIGS. 1-2, the semiconductor light emitting device 100 further may include an insulating film 132 disposed between the second contact electrode 152 and the second connection electrode 156 and having a plurality of openings h, and the second electrode layer 150 may further include an interconnection electrode 154 disposed on the insulating film 132 and connecting the second contact electrode 152 and the second connection electrode 156 through the plurality of openings h.

The first contact electrode 142 may be a transparent electrode layer. For example, the first contact electrode 142 may include at least one material of Indium Tin Oxide (ITO), Zinc-doped Indium Tin Oxide (ZITO), Zinc Indium Oxide (ZIO), Gallium Indium Oxide (GIO), Zinc Tin Oxide (ZTO), Fluorine-doped Tin Oxide (FTO), Aluminum-doped Zinc Oxide (AZO), Gallium-doped Zinc Oxide (GZO), $In_4Sn_3O_{12}$ or $Zn_{(1-x)}Mg_xO$ (Zinc Magnesium Oxide, $0 \leq x \leq 1$). A thickness of the first contact electrode 142 is not limited thereto, but may be in the range of about 1 to about 5 nm. For example, the interconnection electrode 154 and the second contact electrode 152 may include at least one material of Ag, Al, Ni, Cr, Cu, Au, Pd, Pt, Sn, W, Rh, Ir, Ru, Mg, Zn, or alloys containing these materials. For example, the first connection electrode 146 and the second connection electrode 156 may include at least one material of Al, Au, W, Pt, Si, Ir, Ag, Cu, Ni, Ti, Cr, or alloys thereof.

The leveling electrode layer 156L employed in the embodiment illustrated in FIGS. 1-2 may be formed, together with the second electrode layer 150. As in the embodiment illustrated in FIGS. 1-2, when the second electrode layer 150 is provided as a plurality of layers, the leveling electrode layer 156L may be formed, together with the second connection electrode 156 for the second electrode extension 156E (see FIG. 6A). For example, the leveling electrode layer 156L may include the same electrode material as the second connection electrode 156, e.g., the second electrode extension 156E. In addition, the leveling electrode layer 156L may have a thickness t2, equal to a thickness t1 of the second electrode extension 156E.

The insulating film 132 may serve as an etching stop layer during a selective etching operation of the light emitting structure 120 to open the first and second regions PA1 and PA2. The insulating film 132 may also remain in the first and second regions PA1 and PA2, and the remaining portion of the insulating film 132 may have a thickness tb, less than a thickness to of a portion of the insulating film, located below the light emitting structure 120. The insulating film 132 may include a first opening O1 and a second opening O2, extending into the first and second regions PA1 and PA2 of the substrate structure 190, and opening the leveling electrode layer 156L and the second electrode extension 156E, respectively. In the embodiment illustrated in FIGS. 1-2, the first and second pads 180A and 180B are illustrated to be provided as a single pad, respectively, but at least one of the first and second pads 180A and 180B may be configured to be provided as a plurality of pads. In addition, the openings O1 and O2 of the insulating film 132 may be formed in conformity with the number of pads 180A and 180B. However, in some embodiments, openings for pads arranged adjacent to a corner, as in the first and second pads 180A and 180B, may be provided as a single opening.

Further, in other embodiments, in addition to the insulating film 132, an additional etching stop layer, disposed on a portion of the insulating film 132, located in the first and second regions PA1 and PA2 and extending onto a surface of a portion of the second conductivity-type semiconductor layer 126, may be further formed. In the case of an additional etching stop layer, the additional etching stop layer may also have openings corresponding to the first and second openings O1 and O2.

In the embodiment illustrated in FIGS. 1-2, an upper surface of the light emitting structure 120, e.g., an upper surface of the first conductivity-type semiconductor layer 122 may have irregularities P to improve efficiency for light extraction. In addition, the semiconductor light emitting device 100 may include a passivation layer 179 disposed on a surface of the light emitting structure 120 and on the insulating film 132 located in the first and second regions PA1 and PA2.

Figure 3A:
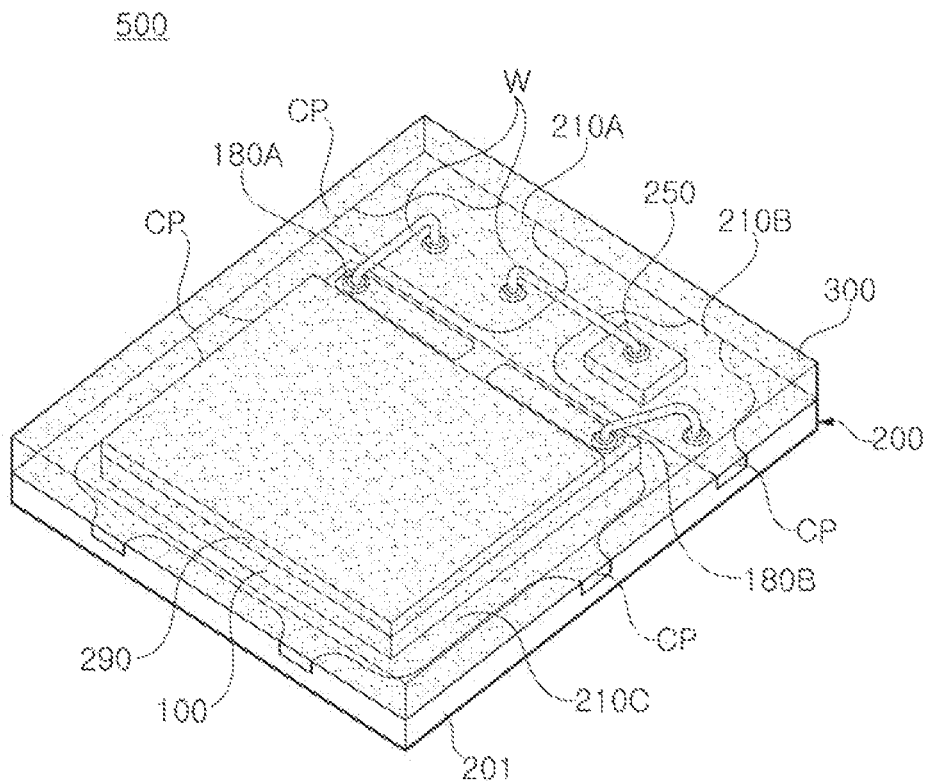
FIGS. 3A to 3C are a perspective view, a cross-sectional side view, and a bottom view, respectively, illustrating a light emitting device package employing the semiconductor light emitting device of FIG. 1, according to an embodiment.
Figure 3B:
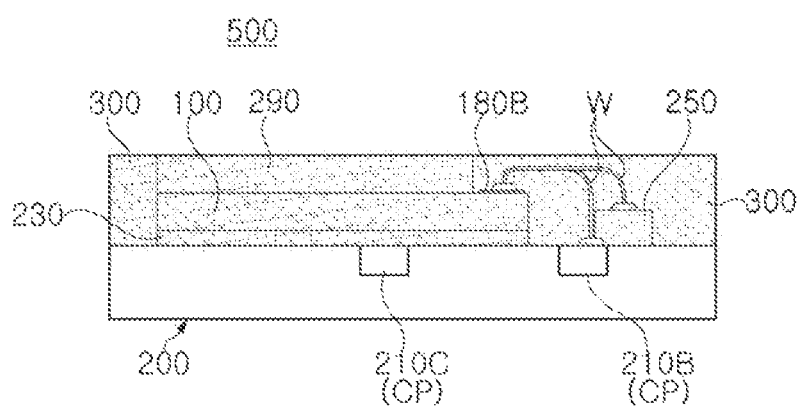
Figure 3C:
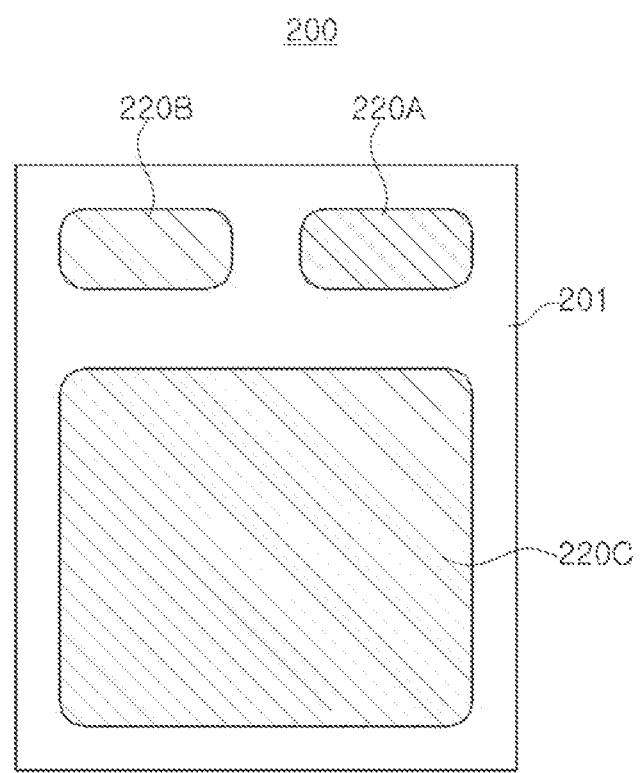

FIGS. 3A to 3C are a perspective view, a cross-sectional side view, and a bottom view, respectively, illustrating a light emitting device package employing the semiconductor light emitting device of FIG. 1, according to an embodiment.

Referring to FIGS. 3A and 3B, a light emitting device package 500 may include a package substrate 200 having a heat dissipation lead frame 210C, a first lead frame 210A, and a second lead frame 210B, and a semiconductor light emitting device 100 disposed on the package substrate 200. According to some embodiments, the semiconductor light emitting device 100 may be the semiconductor light emitting device illustrated in FIGS. 1 and 2.

The package substrate 200 may include a package body 201 bonding to the heat dissipation lead frame 210C and the first and second lead frames 210A and 210B, and, as illustrated in FIGS. 3A and 3C, the heat dissipation lead frame 210C and the first and second lead frames 210A and 210B may be configured to pass through an upper surface and a lower surface of the package body 201, respectively. The heat dissipation lead frame 210C may have a planar area larger than a planar area of each of the first and second lead frames 210A and 210B, to be advantageous in dissipating heat.

The semiconductor light emitting device 100 may be mounted on the heat dissipation lead frame 210C. The substrate structure 190 of the semiconductor light emitting device 100 may be joined to a surface of the heat dissipating lead frame 210C by a joining layer 230. Since, as described with reference to the embodiment of FIGS. 1-2, the substrate structure 190 may be not used as an electrode, the heat dissipation lead frame 210C may be connected to an external heat dissipation unit other than a motherboard or the like, to provide an excellent heat dissipation path for the semiconductor light emitting device 100.

Each of a first pad 180A and a second pad 180B of the semiconductor light emitting device 100 may be electrically connected to the first and second lead frames 210A and 210B, respectively, using a wire W. In some embodiments, as illustrated in FIGS. 3A-3C, a component 250, such as a Zener diode, may be additionally mounted on the second lead frame 210B.

The semiconductor light emitting device 100 may further include a wavelength conversion layer 290 disposed on the light emitting structure 120. The wavelength conversion layer 290 may include a wavelength conversion material, such as a phosphor or quantum dot, converting a wavelength of light generated from the semiconductor light emitting device 100.

In addition, the light emitting device package 500 may further include a reflective resin layer 300 disposed on the package substrate 200 and surrounding the semiconductor light emitting device 100. The reflective resin layer 300 may include a molding member including light reflective powders such as $TiO_2$, $Al_2O_3$, or the like.

In this manner, the light emitting device package 500 may be mounted on a motherboard such as a PCB (e.g., Al PCB). Since the light emitting device package 500 according to the embodiment illustrated in FIGS. 3A-3C employs the lead frames 210A, 210B, and 210C such as Cu, a difference in coefficient of thermal expansion (CTE) with the motherboard may be greatly reduced, as compared to a related art package substrate made of ceramic material having a large difference in CTE. As a result, since occurrence of cracks in a solder connecting the package substrate 200 and the motherboard may be reduced, reliability for the light emitting device package 500 may be improved.

In the embodiment illustrated in FIGS. 3A-3C, each of the lead frames 210A, 210B, and 210C may have a connection portion CP extending onto an adjacent side surface of the light emitting device package 500 (best seen in FIG. 3A). The connection portion CP may be a portion connected to a lead frame of an adjacent package substrate in a process of manufacturing a plurality of the package substrates 200, and may be understood as a result remaining after the connected portion CP is cut.

FIGS. 4A, 5A, 6A, 7A, and 8A are cross-sectional views for respective operations of a method of manufacturing a semiconductor light emitting device according to an embodiment, and FIGS. 4B, 5B, 6B, 7B, and 8B are plan views for the respective operations of the method of manufacturing the semiconductor light emitting device according to the embodiment. Here, FIGS. 4A, 5A, 6A, 7A, and 8A may be respective cross-sectional views of the semiconductor light emitting device illustrated in FIGS. 4B, 5B, 6B, 7B, and 8B taken along line I-I'.

Figure 4B:
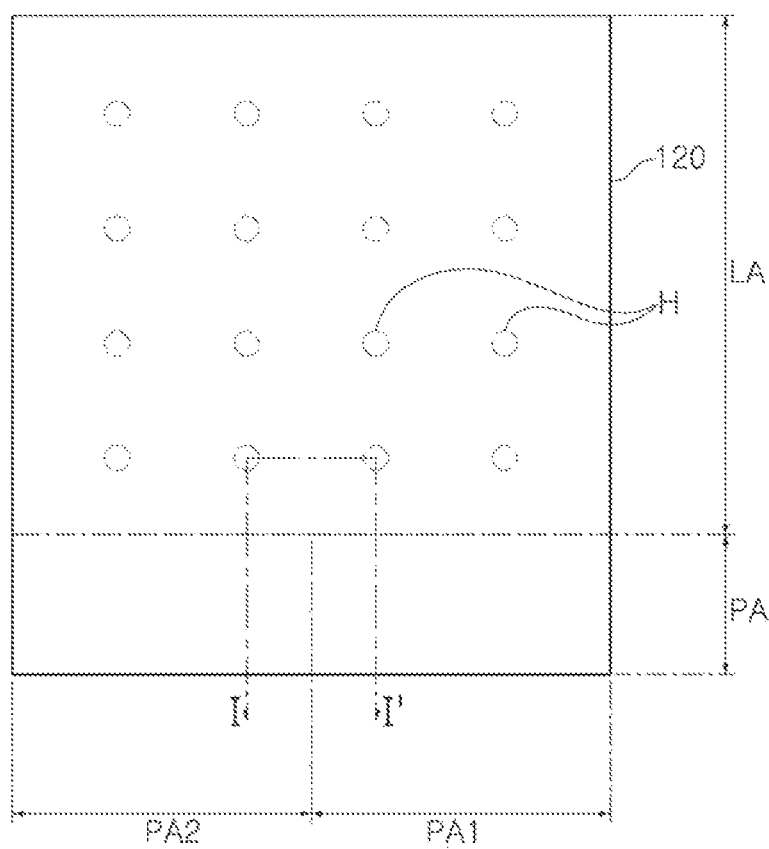
FIGS. 4B, 5B, 6B, 7B, and 8B are plan views for the respective operations of the method of manufacturing the semiconductor light emitting device according to the embodiment.

Referring to FIGS. 4A and 4B, a light emitting structure 120 may be formed on a growth substrate 101, and a plurality of holes H for forming a first electrode layer in a main region LA of the light emitting structure 120 are formed.

The light emitting structure 120 may be formed by sequentially forming a first conductivity-type semiconductor layer 122, an active layer 125, and a second conductivity-type semiconductor layer 126 on the growth substrate 101. For example, the growth substrate 101 may include an insulating material, a conductive material, or a semiconductor material, such as sapphire, Si, SiC, $MgAl_2O_4$, MgO, $LiAlO_2$, $LiGaO_2$, GaN, or the like. Each layer of the light emitting structure 120 may be a nitride semiconductor layer described in the embodiment illustrated in FIGS. 1-2, and may be grown using a process such as a Metal Organic Chemical Vapor Deposition (MOCVD) process, a Hydrogen Vapor Phase Epitaxy (HVPE) process, a Molecular Beam Epitaxy (MBE) process, or the like.

An upper surface of the growth substrate 101 may have a concavo-convex structure S. Such a concavo-convex structure S may improve crystallinity and light emission efficiency for semiconductor layers constituting the light emitting structure 120.

Although not illustrated in the drawings, before forming the light emitting structure 120, a buffer layer may be formed on the upper surface of the growth substrate 101. The buffer layer may be for mitigating lattice defects in a semiconductor layer grown on the growth substrate 101, and may be formed of an undoped semiconductor layer made of nitride or the like. Undoped GaN, AlN, InGaN, or the like may be applied to the buffer layer.

The first conductivity-type semiconductor layer 122 may be formed of a semiconductor doped with n-type impurities and may be an n-type nitride semiconductor layer, and the second conductivity-type semiconductor layer 126 may be formed of a semiconductor doped with p-type impurities and may be a p-type nitride semiconductor layer. As described above, the first and second conductivity-type semiconductor layers 122 and 126 may have $Al_xIn_yGa_{(1-x-y)}N$ (where, $0 \le x < 1$, $0 \le y < 1$, and $0 \le x+y < 1$)), and, for example, may be materials such as GaN, AlGaN, InGaN, and/or AlInGaN. For example, the active layer 125 may include an InGaN-based compound quantum well layer, and may have a Multiple Quantum Well (MQW) structure in which a quantum well layer and a quantum barrier layer are alternately stacked with each other, and, for example, may have an InGaN/GaN structure. However, embodiments are not limited thereto and, in some embodiments, the active layer 125 may have a Single Quantum Well (SQW) structure.

Subsequently, the holes H exposing a portion of the first conductivity-type semiconductor layer 122 may be formed in the light emitting structure 120. An operation of forming the holes H may be implemented by an etching process of removing a portion of the second conductivity-type semiconductor layer 126 and a portion of the active layer 125. A portion of the first conductivity-type semiconductor layer 122 exposed by the holes H may be provided as a region for the first electrode layer.

Figure 5A:
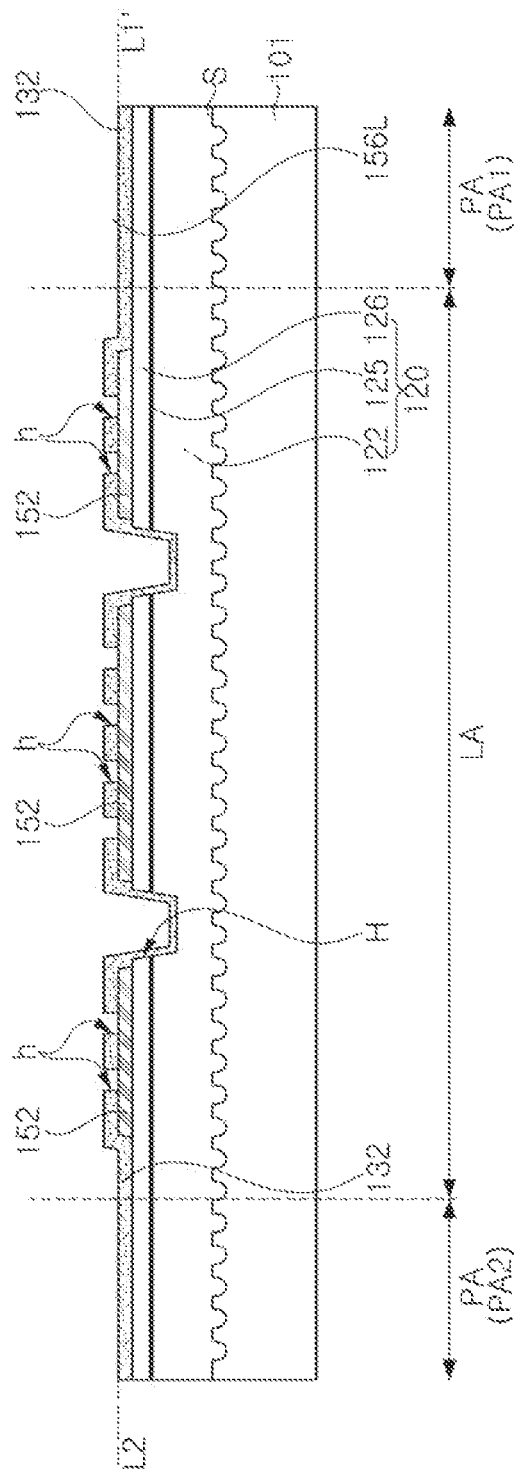
Figure 5B:
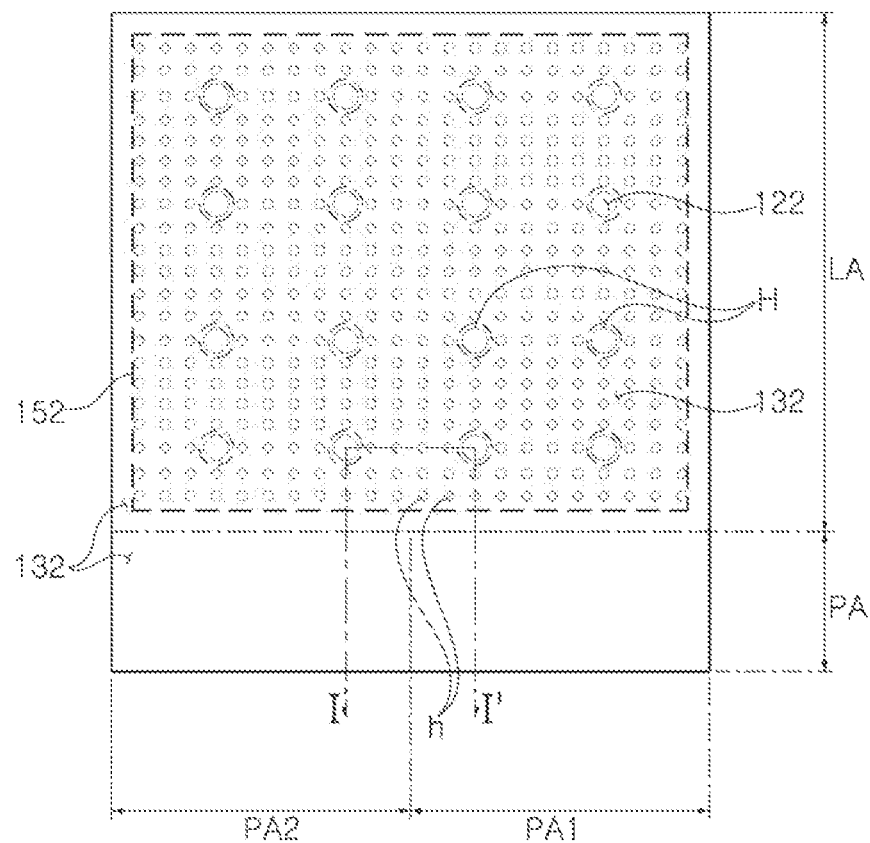

Next, a second electrode layer (150 in FIG. 6A) connected to the second conductivity-type semiconductor layer 126 may be formed by the operations illustrated in FIGS. 5A and 5B.

Referring to FIGS. 5A and 5B, a second contact electrode 152 may be formed on the second conductivity-type semiconductor layer 122 of the light emitting structure 120 located in the main region LA, and an insulating film 132 having a plurality of openings h may be formed on the second contact electrode 152.

The second contact electrode 152 may include an ohmic contact material. In some embodiments, the second contact electrode 152 may be a transparent electrode. For example, the transparent electrode may include ITO, ZITO, ZIO, GIO, ZTO, FTO, AZO, GZO, $In_4Sn_3O_{12}$, or $Zn_{(1-x)}Mg_xO$ (where $0 \le x \le 1$).

The insulating film 132 may have the plurality of openings h that expose a portion of the second contact electrode 152. The plurality of openings h may be arranged in the insulating film 132 at various sizes and intervals to have a current dispersion effect. The various sizes and intervals may be predetermined. For example, the insulating film 132 may include $SiO_2$, SiN, $SiO_xN_y$, $TiO_2$, $Si_3N_4$, $Al_2O_3$, TiN, AlN, $ZrO_2$, TiAlN, TiSiN, HfO, $NbO_2$, $TaO_2$, or $MgF_2$. In some embodiments, the insulating film 132 may be used as an etching stop layer during a selective etching operation of the light emitting structure 120.

Figure 6A:
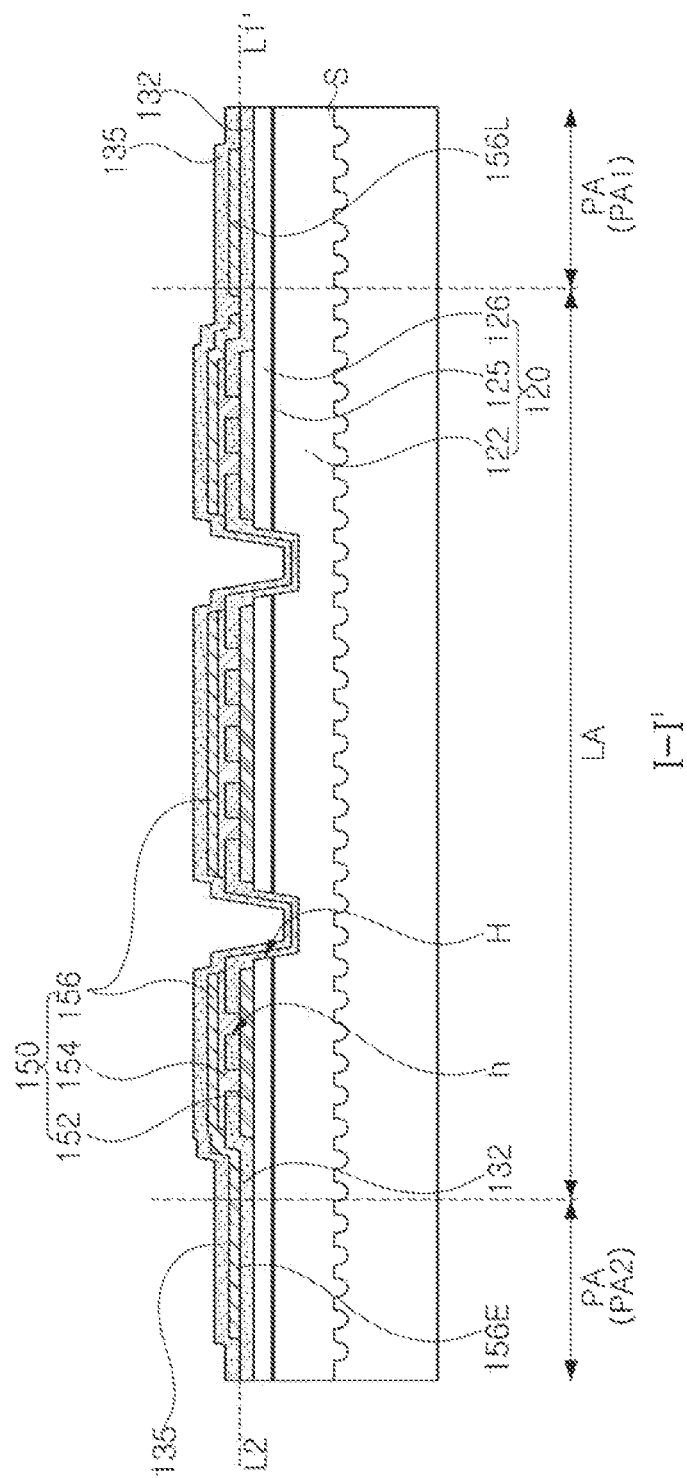
Figure 6B:
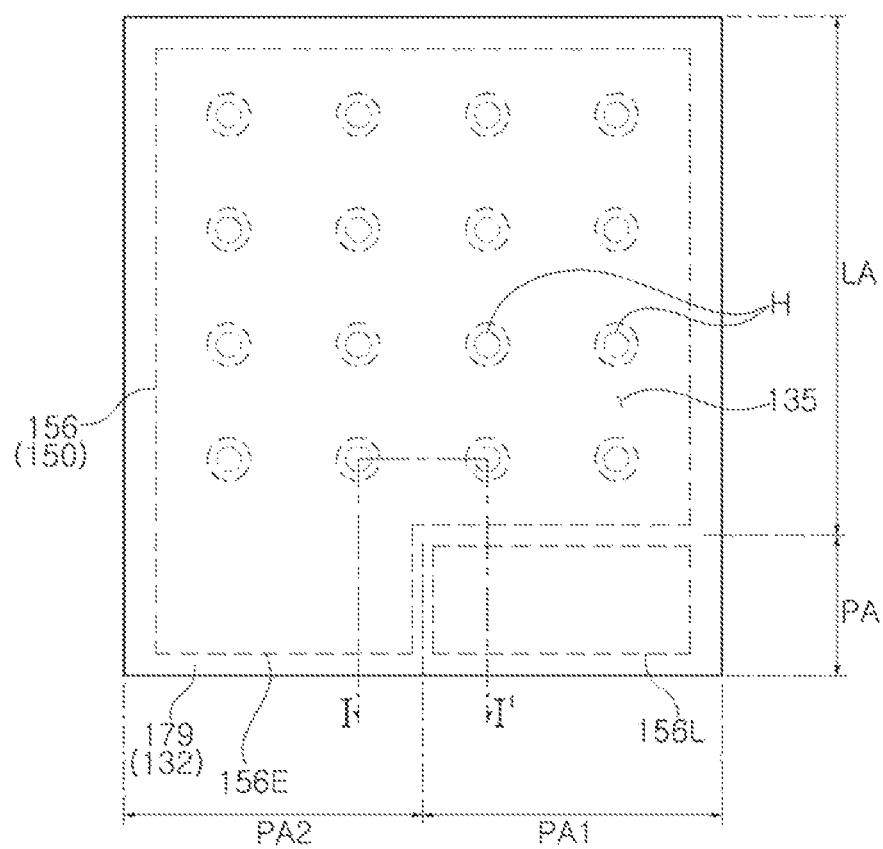

Next, referring to FIGS. 6A and 6B, an interconnection electrode 154 and a second connection electrode 156 may be formed to prepare a second electrode layer 150, and an interlayer insulating layer 135 may be formed to cover the second electrode layer 150.

The interconnection electrode 154 may be disposed on the insulating film 132 to be electrically connected to the second contact electrode 152 through the plurality of openings h. For example, the electrode material described above may be used for the second contact electrode 152. In some embodiments, the second contact electrode 152 may include Ag, Cr, Ni, Ti, Al, Rh, Ru, Au, or a combination thereof, as a reflective electrode.

The second connection electrode 156 may be formed on the interconnection electrode 154. The second connection electrode 156 may be formed to have a second electrode extension 156E extending in a second region PA2. In addition, when the second connection electrode 156 is formed, a leveling electrode layer 156L may be formed together in a first region PA1. The leveling electrode layer 156L may be electrically separated from the second connection electrode 156. Since the leveling electrode layer 156L and the second connection electrode 156 may be formed at the same time, the leveling electrode layer 156L may include substantially the same material as a material of the second connection electrode 156, and may have substantially the same thickness as a thickness of the second electrode extension 156E.

In this manner, surfaces on which the second electrode extension 156E and the leveling electrode layer 156L are formed (e.g., lower surfaces L2 and L1' of the second electrode extension 156E and the second leveling electrode layer 156L) may have the same level. For example, the second connection electrode 156 and the leveling electrode layer 156L may include at least one of materials such as Al, Au, W, Pt, Si, Ir, Ag, Cu, Ni, Ti, Cr, and alloys thereof.

The interlayer insulating layer 135 may be formed on the light emitting structure 120 to cover the second electrode layer 150. The interlayer insulating layer 135 may guarantee insulation between the second electrode layer 150 and a first electrode layer 140 to be formed in a subsequent operation. For example, the interlayer insulating layer 135 may include $SiO_2$, $Si_3N_4$, $HfO_2$, SiON, $TiO_2$, $Ta_2O_3$, or $SnO_2$.

Figure 7A:
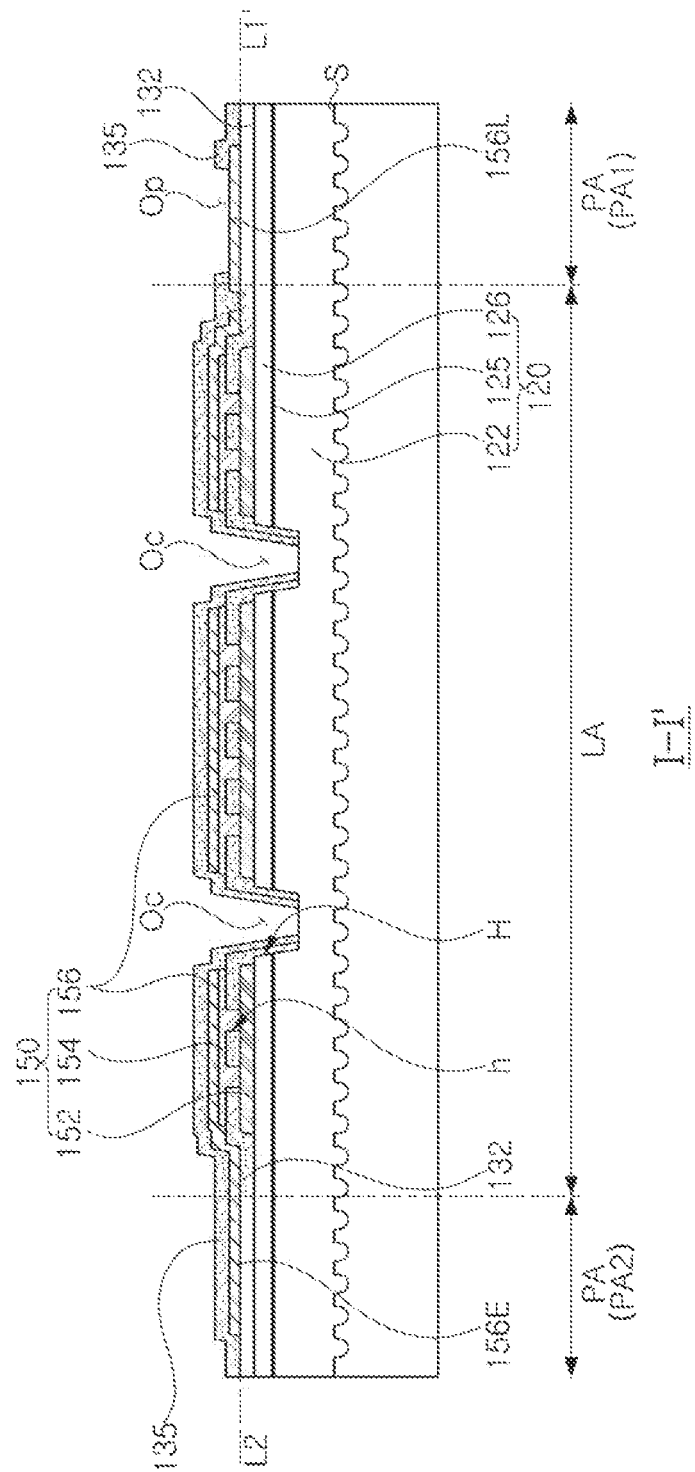
Figure 7B:
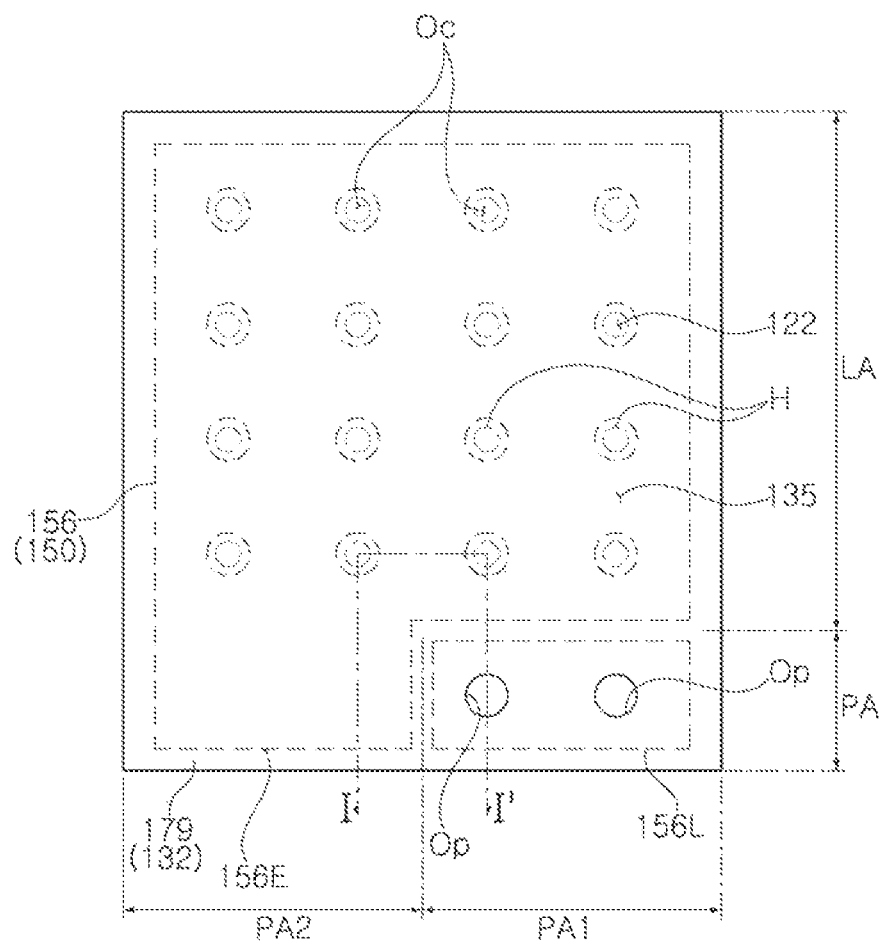

Next, a first electrode layer (140 in FIG. 8A) connected to the first conductivity-type semiconductor layer 122 may be formed by the operations illustrated in FIGS. 7A and 7B.

Referring to FIGS. 7A and 7B, the interlayer insulating layer 135 may be partially removed to form a plurality of first openings Oc and a plurality of second openings Op.

The plurality of first openings Oc may expose a portion of the first conductivity-type semiconductor layer 122, and the plurality of second openings Op may expose a portion of the leveling electrode layer 156L. The plurality of first openings Oc may be formed by removing a portion of the interlayer insulating layer 135 located on a bottom surface of the hole H, and may provide a contact region for a first electrode layer (140 in FIG. 8A). The plurality of second openings Op may be formed by removing a portion of the interlayer insulating layer 135 located in the first region PA1, and may provide a contact region for a first electrode extension (146E in FIG. 8A).

Figure 8A:
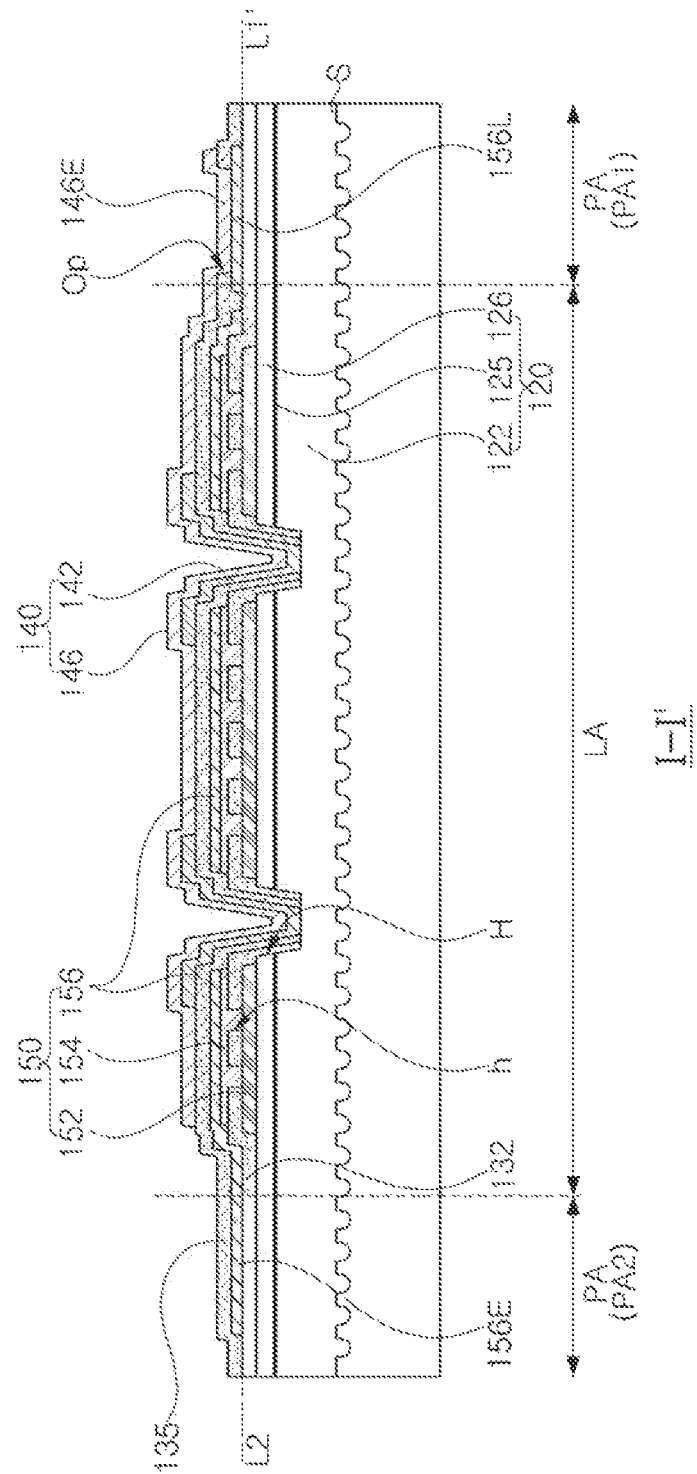
Figure 8B:
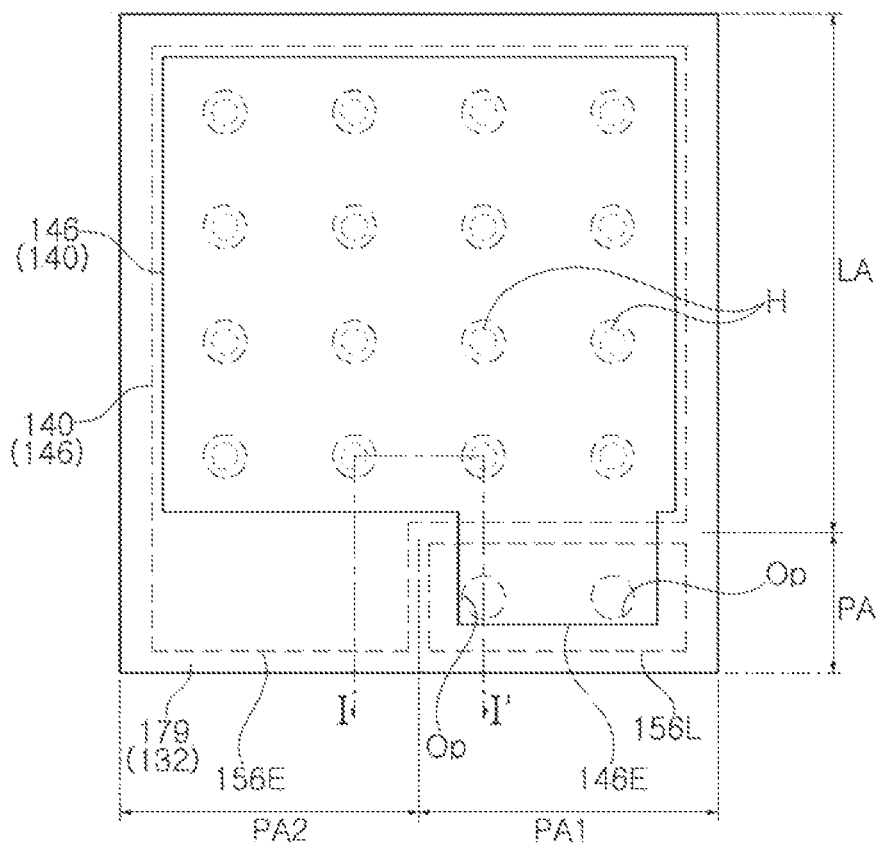

Next, referring to FIGS. 8A and 8B, a first contact electrode 142 and a first connection electrode 146 may be formed on the interlayer insulating layer 135.

The first contact electrode 142 connected to a portion of the first conductivity-type semiconductor layer 122 through the plurality of first openings Oc may be formed, and the first connection electrode 146 may be formed on the first contact electrode 142.

The first connection electrode 146 may be formed to have a first electrode extension 146E extending in the first region PA1. The first electrode extension 146E may be connected to the leveling electrode layer 156L through the second opening Op. Therefore, the leveling electrode layer 156L may be connected to the first electrode layer 150, and may be provided as a region for a first pad (180A of FIGS. 1-2). For example, the first contact electrode 142 may include at least one material of Ag, Al, Ni, Cr, Cu, Au, Pd, Pt, Sn, W, Rh, Ir, Ru, Mg, Zn, or alloys thereof. For example, the first connection electrode 146 may include at least one of materials such as Al, Au, W, Pt, Si, Ir, Ag, Cu, Ni, Ti, Cr, or alloys thereof.

Figure 10:
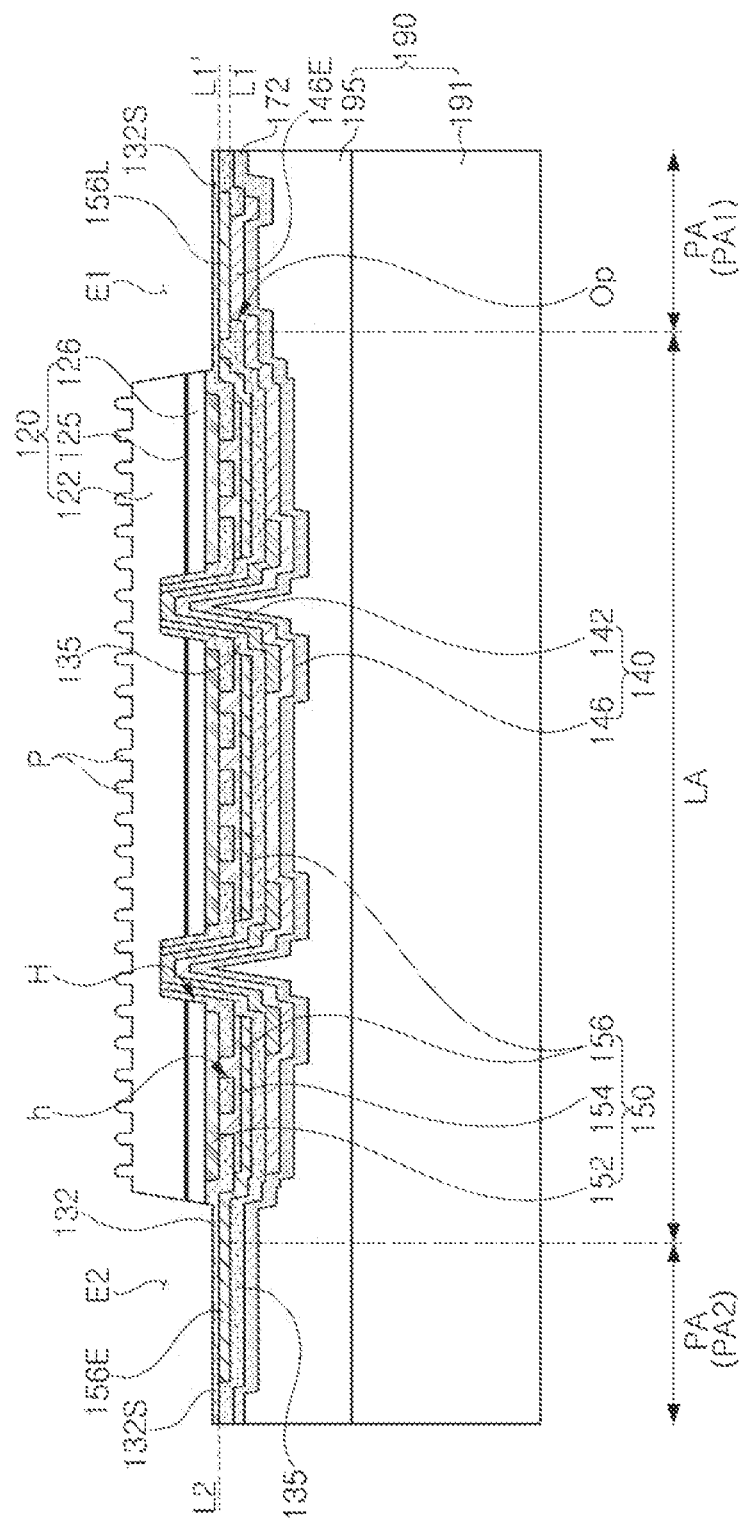
Figure 11:
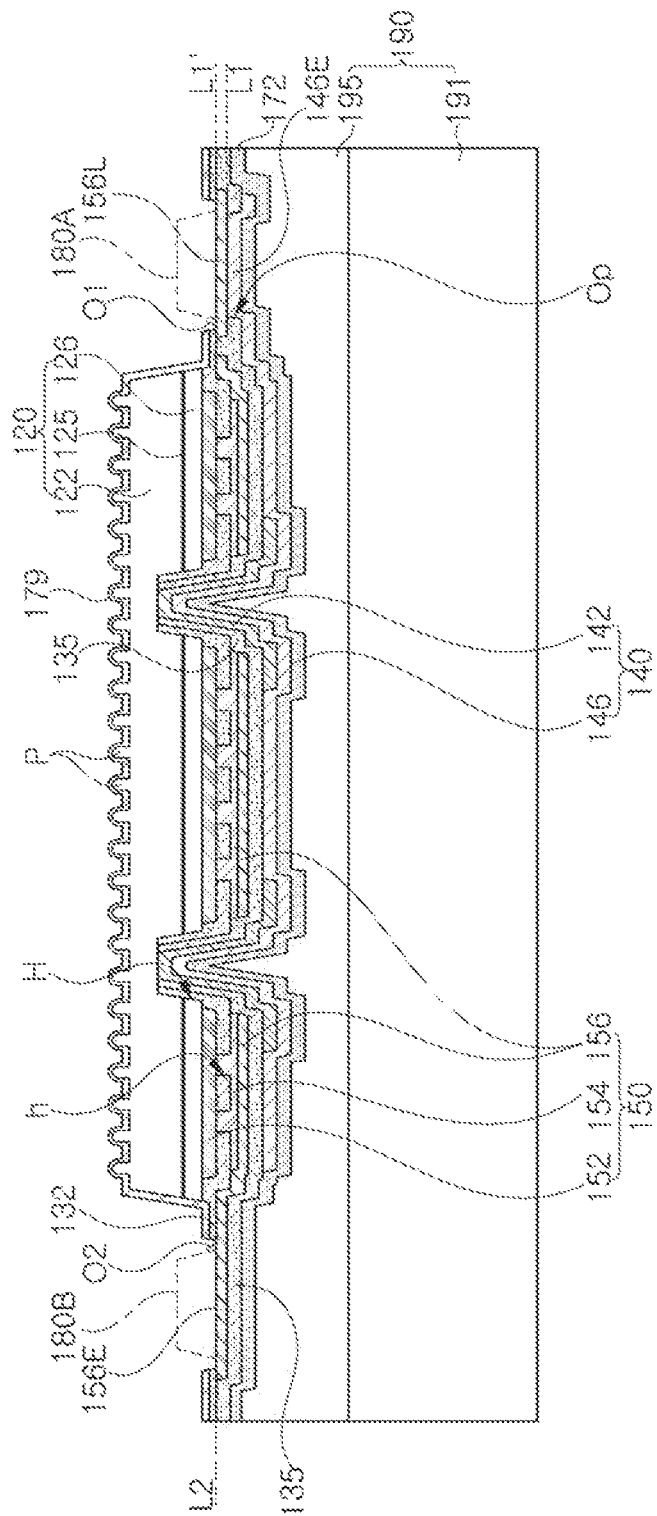

Next, as illustrated in FIGS. 9 to 11, an operation of transferring the light emitting structure 120 using a support substrate 191 may be performed, and an operation of forming first and second pads after removing the growth substrate 101 may be performed.

Referring to FIG. 9, a substrate structure 190 may be formed on the light emitting structure 120.

In the embodiment illustrated in FIG. 9, an insulating separation layer 172 may be formed on the light emitting structure 120. A support substrate 191 may be bonded to the insulating separation layer 172 using the bonding metal layer 195, to provide a substrate structure 190. For example, the support substrate 191 may be a conductive substrate such as a silicon (Si) substrate, and the bonding metal layer 195 may be a bonding metal such as Au, Sn, Ni, Au—Sn, Ni—Sn, or Ni—Au—Sn. The substrate structure 190 may be a conductive structure and may not function as an electrode structure, due to the presence of the insulating separation layer 172.

Next, referring to FIG. 10, the growth substrate 101 may be removed from the light emitting structure 120, and portions of the light emitting structure 120 located in the first and second regions PA1 and PA2 may be removed.

The removal of the growth substrate 101 may be performed by various processes such as a laser lift-off process, a mechanical polishing process, a mechanical-chemical polishing process, or a chemical etching process. For example, in the case of a silicon substrate, the growth substrate 101 may be removed by a mechanical polishing process or a mechanical-chemical polishing process, and in the case of a sapphire substrate, the growth substrate 101 may be removed by a laser lift-off process. A concavo-convex structure P may be formed on a surface of the light emitting structure 120 from which the growth substrate 101 is removed. The concavo-convex structure P having a shape corresponding to the concavo-convex structure S of the growth substrate 101 may be provided. These concavo-convex structures P may improve an extraction efficiency of light emitted from the active layer 125.

Subsequently, portions of the light emitting structure 120 located in the first and second regions PA1 and PA2 may be removed. For example, in some embodiments, the portions of the light emitting structure 120 may be removed by an etching operation. The first and second regions PA1 and PA2 obtained in this etching operation may be provided as regions for forming first and second pads 180A and 180B in FIG. 11 The etching operation may be performed to have the same depth, and a remaining insulating film 132S used as an etching stop layer may remain in first and second etched regions E1 and E2 to have a reduced thickness. Since the remaining insulating film 132S in the first and second etched regions E1 and E2 has substantially the same thickness, the leveling electrode layer 156L and a portion of the second electrode extension 156E may be easily exposed. In another embodiment, the etching operation may be performed to expose the leveling electrode layer 156L and the second electrode extension 156E. Even in such a case, since an upper surface of the leveling electrode layer 156L and an upper surface of the second electrode extension 156E may be located on the same level, an etching operation for forming a pad may be performed by a single etching process.

Next, referring to FIG. 11, a passivation layer 179 may be formed on a surface of the light emitting structure 120 and a surface of the remaining insulating film 132 located in the first and second regions PA1 and PA2, and the insulating film 132 and the passivation layer 179 may be partially removed to form first and second openings O1 and O2. The leveling electrode layer 152L may be exposed through the first opening O1, and the second electrode extension 152E may be exposed through the second opening O2. Levels of exposed regions of the leveling electrode layer 152L and the second electrode extension 152E may be substantially the same. First and second pads 180A and 180B may be formed in exposed regions of the leveling electrode layer 152L and the second electrode extension 152E, respectively. The first and second pads 180A and 180B may be also located on substantially the same level.

Figure 12:
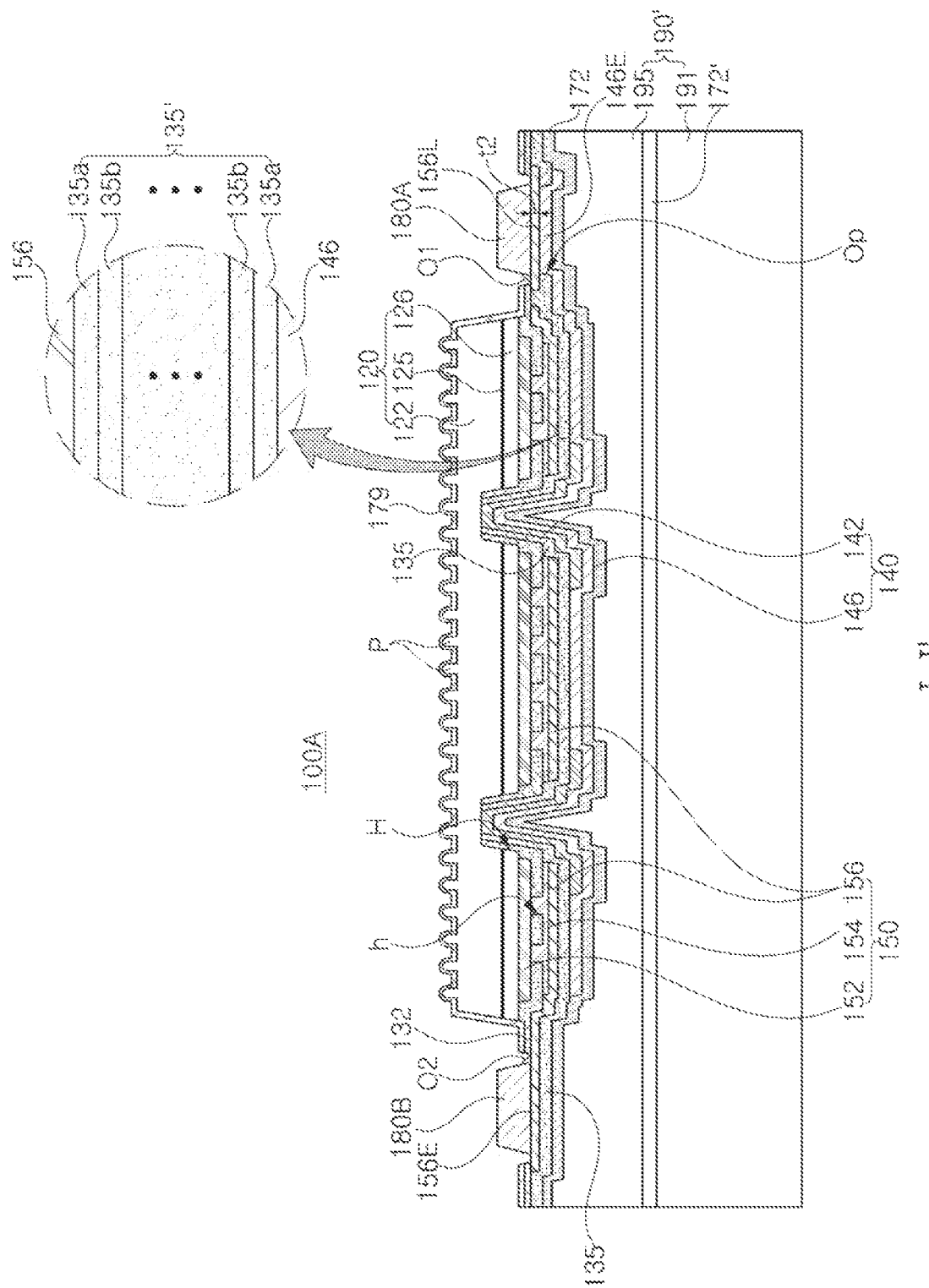
FIG. 12 is a cross-sectional view illustrating a semiconductor light emitting device according to an embodiment.

FIG. 12 is a cross-sectional view illustrating a semiconductor light emitting device according to an embodiment.

Referring to FIG. 12, a semiconductor light emitting device 100A may be understood as being similar to the semiconductor light emitting device 100 illustrated in FIGS. 1 and 2, except that a different insulating separation structure for a substrate structure 190' is included, and an interlayer insulating layer 135' is configured to have a Distributed Bragg Reflector (DBR) structure. In addition, components of the embodiment illustrated in FIG. 12 may be understood with reference to the descriptions of the same components as or components similar to the semiconductor light emitting device 100 described in FIGS. 1 and 2, unless otherwise specified. Thus, a repeated description thereof is omitted for conciseness.

A substrate structure 190' employed in the embodiment illustrated in FIG. 12 may include a support substrate 191, a bonding metal layer 195 disposed between the support substrate 191 and a light emitting structure 120, and an insulating separation layer 172' disposed between the support substrate 191 and the bonding metal layer 195. Before bonding the support substrate 191 to the light emitting structure 120 using the bonding metal layer 195, the insulating separation layer 172' may be formed on a bonding surface of the support substrate 191 in advance.

An interlayer insulating layer 135' may be provided as a Distributed Bragg Reflector (DBR). The interlayer insulating layer 135' may be a multilayer film in which a first insulating layer 135a having a first refractive index and a second insulating layer 135b having a second refractive index which is different than the first refractive index are alternately stacked. For example, the first and second insulating layers 135a and 135b may include $SiO_2$, SiN, $SiO_xN_y$, $TiO_2$, $Si_3N_4$, $Al_2O_3$, TiN, AlN, $ZrO_2$, TiAlN, TiSiN, HfO, $NbO_2$, $TaO_2$, or $MgF_2$. In some embodiments, the insulating film 132 may have a DBR multilayer reflective layer structure instead of the interlayer insulating layer 135'.

In another embodiment, the interlayer insulating layer 135' may constitute an Omni Directional Reflector (ODR), together with a second connection electrode 156 that may be a reflective electrode. These various reflective structures may greatly improve light extraction efficiency in a desired direction by increasing reflectance of light emitted from an active layer 125.

Figure 13:
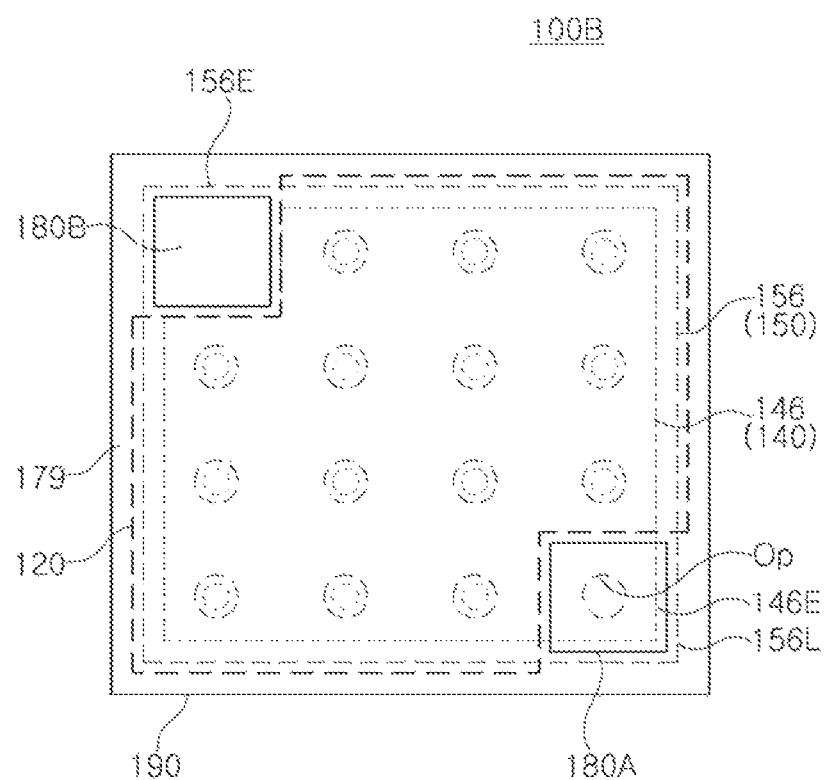
FIG. 13 is a plan view illustrating a semiconductor light emitting device according to an embodiment.

FIG. 13 is a plan view illustrating a semiconductor light emitting device according to an embodiment.

Referring to FIG. 13, a semiconductor light emitting device 100B may be understood as being similar to the semiconductor light emitting device 100 illustrated in FIGS. 1 and 2, except that regions in which first and second pads 180A and 180B are arranged are different from each other. In addition, components of the embodiment illustrated in FIG. 13 may be understood with reference to the descriptions of the same components as or components similar to the semiconductor light emitting device 100 described in FIGS. 1 and 2, unless otherwise specified. Thus, a repeated description thereof is omitted for conciseness.

Unlike the embodiments illustrated in FIGS. 1-12, the first and second pads 180A and 180B employed in the embodiment illustrated in FIG. 13 may be arranged in a space separated by a main region LA, e.g., a light emitting structure 120. As illustrated in FIG. 13, the first and second pads 180A and 180B may be arranged in a diagonal direction in plan view. As such, the first and second pads 180A and 180B may have various arrangements. In addition, at least one of the first and second pads 180A and 180B may be arranged in different amounts.

According to various embodiments disclosed herein, a semiconductor light emitting device may provide first and second pads in a region from which a light emitting structure is removed to use a heat dissipation lead frame in a package structure, to secure an excellent heat dissipation path, without using a substrate structure as an electrode. The substrate structure of the semiconductor light emitting device may be mounted to be connected to the heat dissipation lead frame. A level difference between regions in which the first and second pads are formed may be minimized to simplify an operation of etching the light emitting structure.

While example embodiments have been illustrated and described above, it will be apparent to those skilled in the art that modifications and variations could be made without departing from the scope of the present disclosure as defined by the appended claims.

What is claimed is:

1. A semiconductor light emitting device comprising:
   a substrate structure having an upper surface, the upper surface having a first region, a second region, and a third region;
   a light emitting structure including a first conductivity-type semiconductor layer, an active layer, and a second conductivity-type semiconductor layer, sequentially stacked on the third region of the substrate structure, and having a hole passing through the second conductivity-type semiconductor layer and the active layer;
   a first electrode layer disposed between the substrate structure and the light emitting structure, and connected to the first conductivity-type semiconductor layer through the hole, the first electrode layer having a first electrode extension extending onto the first region;
   a second electrode layer disposed between the first electrode layer and the light emitting structure, and connected to the second conductivity-type semiconductor layer, the second electrode layer having a second electrode extension extending onto the second region, wherein the second electrode extension has an upper surface higher than an upper surface of the first electrode extension;
   an interlayer insulating layer disposed between the first electrode layer and the second electrode layer, and extending onto the first region and the second region, the interlayer insulating layer having an opening in the first region exposing a portion of the first electrode extension;
   a pad electrode layer disposed on the exposed portion of the first electrode extension through the opening, and having an upper surface that reduces a level difference between the upper surface of the first electrode extension and the upper surface of the second electrode extension; and
   a first pad and a second pad, respectively disposed on the upper surface of the pad electrode layer and the upper surface of the second electrode extension.

2. The semiconductor light emitting device according to claim 1, wherein the upper surface of the pad electrode layer is located on substantially a same level as the upper surface of the second electrode extension.

3. The semiconductor light emitting device according to claim 1, wherein the pad electrode layer comprises a same material as a material of the second electrode extension.

4. The semiconductor light emitting device according to claim 1, wherein the substrate structure is electrically insulated from the light emitting structure.

5. The semiconductor light emitting device according to claim 4, further comprising an insulating separation layer disposed on the interlayer insulating layer to cover the first electrode layer,
   wherein the substrate structure comprises a support substrate, and a bonding metal layer disposed between the support substrate and the insulating separation layer.

6. The semiconductor light emitting device according to claim 4, wherein the substrate structure comprises a support substrate, a bonding metal layer disposed between the support substrate and the light emitting structure, and an insulating separation layer disposed between the support substrate and the bonding metal layer.

7. The semiconductor light emitting device according to claim 1, further comprising an etching stop layer disposed in the first region and the second region of the substrate structure, extending onto a partial surface of the second conductivity-type semiconductor layer, and having a first opening that exposes the pad electrode layer and a second opening that exposes the second electrode extension.

8. The semiconductor light emitting device according to claim 1, wherein the first electrode layer comprises a first contact electrode connected to the first conductivity-type semiconductor layer through the hole, and a first connection electrode disposed on the first contact electrode and providing the first electrode extension.

9. The semiconductor light emitting device according to claim 1, wherein the second electrode layer comprises a second contact electrode connected to the second conductivity-type semiconductor layer, and a second connection electrode disposed on the second contact electrode and providing the second electrode extension.

10. The semiconductor light emitting device according to claim 9, further comprising an insulating film disposed between the second contact electrode and the second connection electrode and having a plurality of openings,
    wherein the second electrode layer further comprises an interconnection electrode disposed on the insulating film, and connecting the second contact electrode and the second connection electrode through the plurality of openings.

11. The semiconductor light emitting device according to claim 10, wherein the insulating film extends to the first region and the second region of the substrate structure, and has at least one opening that exposes a portion of the pad electrode layer and at least one opening that exposes a portion of the second electrode extension.

12. The semiconductor light emitting device according to claim 1, wherein the first region and the second region are arranged along one side of the third region.

13. A semiconductor light emitting device comprising:
    a substrate structure having an upper surface, the upper surface having a first region, a second region, and a third region;
    a light emitting structure having a first conductivity-type semiconductor layer, an active layer, and a second conductivity-type semiconductor layer, sequentially stacked on the third region of the substrate structure;
    a first electrode layer disposed between the substrate structure and the light emitting structure, and connected to the first conductivity-type semiconductor layer, and the first electrode layer having a first electrode extension extending onto the first region;
a second electrode layer disposed between the first electrode layer and the light emitting structure, connected to the second conductivity-type semiconductor layer, and having a second electrode extension, extending onto the second region, wherein the second electrode extension has an upper surface higher than an upper surface of the first electrode extension;
a leveling electrode layer disposed on the upper surface of the first electrode extension, and having an upper surface that reduces a level difference between the upper surface of the first electrode extension and the upper surface of the second electrode extension;
an interlayer insulating layer disposed between the first electrode layer and the second electrode layer, and extending onto the first region and the second region, the interlayer insulating layer having an opening that exposes the first electrode extension and the leveling electrode layer; and
a first pad and a second pad, respectively disposed on the upper surface of the leveling electrode layer and the upper surface of the second electrode extension.

14. The semiconductor light emitting device according to claim 13, wherein the opening of the interlayer insulating layer is filled with by the first electrode extension.

15. The semiconductor light emitting device according to claim 13, wherein the leveling electrode layer has substantially a same thickness as a thickness of the second electrode extension.

16. The semiconductor light emitting device according to claim 13, wherein the upper surface of the leveling electrode layer is located on substantially a same level as a level of the second electrode extension.

17. A light emitting device package comprising:
a package substrate having a heat dissipation lead frame, a first lead frame, and a second lead frame; and
a semiconductor light emitting device including:
a substrate structure having an upper surface having a first region, a second region, and a third region, and a lower surface contacting the heat dissipation lead frame,
a light emitting structure having a first conductivity-type semiconductor layer, an active layer, and a second conductivity-type semiconductor layer, sequentially stacked on the third region of the substrate structure, and
a first pad and a second pad, respectively disposed on the first region and the second region, and electrically connected to the first lead frame and the second lead frame,
wherein the semiconductor light emitting device further comprises:
a first electrode layer disposed between the substrate structure and the light emitting structure, connected to the first conductivity-type semiconductor layer, and having a first electrode extension, extending onto the first region;
a second electrode layer disposed between the first electrode layer and the light emitting structure, connected to the second conductivity-type semiconductor layer, and having a second electrode extension extending onto the second region, wherein the second electrode extension has the second pad disposed thereon and has an upper surface higher than an upper surface of the first electrode extension;
a leveling electrode layer disposed on the upper surface of the first electrode extension, having the first pad disposed thereon, and having an upper surface that reduces a level difference between the upper surface of the first electrode extension and the upper surface of the second electrode extension; and
an interlayer insulating layer disposed between the first electrode layer and the second electrode layer, extending onto the first region and the second region, and having an opening that exposes the first electrode extension and the leveling electrode layer.

18. The light emitting device package according to claim 17, wherein the heat dissipation lead frame has a planar area larger than a planar area of each of the first lead frame and the second lead frame, and is separated from the first lead frame and the second lead frame.

19. The light emitting device package according to claim 17, wherein the semiconductor light emitting device further comprises a wavelength conversion layer disposed on the light emitting structure, and
wherein the light emitting device package further comprises a reflective resin layer disposed on the package substrate and surrounding the semiconductor light emitting device.

* * * * *